(12) United States Patent
van Bentum

(10) Patent No.: US 6,548,369 B1
(45) Date of Patent: Apr. 15, 2003

(54) MULTI-THICKNESS SILICON FILMS ON A SINGLE SEMICONDUCTOR-ON-INSULATOR (SOI) CHIP USING SIMOX

(75) Inventor: Ralf van Bentum, Radebeul (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/812,630

(22) Filed: Mar. 20, 2001

(51) Int. Cl.$^7$ ................................ H01L 21/76
(52) U.S. Cl. .................. 438/404; 438/405; 438/407; 438/423; 438/479; 438/480
(58) Field of Search ................... 257/347, 349, 257/350; 438/405, 407, 479, 480, 423, 404

(56) References Cited

U.S. PATENT DOCUMENTS

| | | | | | |
|---|---|---|---|---|---|
| 5,510,640 A | * | 4/1996 | Shindo | ............... | 257/347 |
| 5,670,388 A | | 9/1997 | Machesney et al. | | |
| 5,707,899 A | * | 1/1998 | Cerofolini et al. | ............... | 438/407 |
| 5,888,297 A | * | 3/1999 | Ogura | ............... | 117/106 |
| 5,918,136 A | * | 6/1999 | Nakashima et al. | ............... | 438/404 |
| 5,930,642 A | * | 7/1999 | Moore et al. | ............... | 257/347 |
| 5,950,076 A | | 9/1999 | Baliga | | |
| 5,956,597 A | * | 9/1999 | Furukawa et al. | ............... | 438/149 |
| 5,973,358 A | | 10/1999 | Kishi | | |
| 5,973,364 A | | 10/1999 | Kawanaka | | |
| 6,090,689 A | * | 7/2000 | Sadana et al. | ............... | 117/84 |
| 6,300,218 B1 | * | 10/2001 | Cohen et al. | ............... | 438/407 |
| 6,329,689 B1 | * | 12/2001 | Manning | ............... | 257/347 |
| 6,350,703 B1 | | 2/2002 | Sakaguchi et al. | | |

* cited by examiner

*Primary Examiner*—Richard Elms
*Assistant Examiner*—Douglas Menz
(74) *Attorney, Agent, or Firm*—Renner, Otto, Boisselle & Sklar, LLP

(57) ABSTRACT

A semiconductor-on-insulator (SOI) chip. The SOI chip having a substrate; a buried oxide (BOX) layer disposed on the substrate; and an active layer disposed on the BOX layer, the active layer divided into a first tile and a second tile, the first tile having a first thickness and the second tile having a second thickness, the second thickness being smaller than the first thickness; wherein the BOX layer is formed under the active layer in an area of the first tile by implanting oxygen ions with a first energy level and a first dosage and the BOX layer is formed under the active layer in an area of the second tile by implanting oxygen ions with a second energy level and a second dosage.

18 Claims, 5 Drawing Sheets

MULTI-THICKNESS SILICON FILMS ON A SINGLE SEMICONDUCTOR-ON-INSULATOR (SOI) CHIP USING SIMOX

TECHNICAL FIELD

The present invention generally relates to semiconductor-on-insulator (SOI) integrated circuits and, more particularly, to an SOI chip having a buried oxide (BOX) layer which defines an active layer having varying thickness.

BACKGROUND ART

Traditional semiconductor-on-insulator (SOI) integrated circuits typically have a silicon substrate having a buried oxide (BOX) layer disposed thereon. A silicon active layer is disposed on the BOX layer. Within the active layer, active devices, such as transistors, are formed in active regions. The size and placement of the active regions are defined by isolation regions. As a result of this arrangement, the active devices are isolated from the substrate by the BOX layer. More specifically, a body region of each SOI transistor does not have body contacts and is therefore "floating."

SOI chips offer potential advantages over bulk chips for the fabrication of high performance integrated circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased.

However, in some instances, it may be desirable to fabricate fully depleted devices on an SOI chip which also has the partially depleted devices described above. For example, a designer may wish to provide devices for analog circuitry which perform better when made from fully depleted devices having no or very little floating body effects compared to the partially depleted devices used for the digital circuitry.

Accordingly, there exists a need in the art for hybrid SOI chips with regions respectively dedicated to fully depleted devices and partially depleted devices. Such a chip could be used for constructing a mixed signal (digital and analog signals) SOI chip with regions respectively suited for digital circuitry and analog circuitry.

SUMMARY OF THE INVENTION

According to one aspect of the invention, the invention is a semiconductor-on-insulator (SOI) chip. The SOI chip having a substrate; a buried oxide (BOX) layer disposed on the substrate; and an active layer disposed on the BOX layer, the active layer divided into a first tile and a second tile, the first tile having a first thickness and the second tile having a second thickness, the second thickness being smaller than the first thickness; wherein the BOX layer is formed under the active layer in an area of the first tile by implanting oxygen ions with a first energy level and a first dosage and the BOX layer is formed under the active layer in an area of the second tile by implanting oxygen ions with a second energy level and a second dosage.

According to another aspect of the invention, the invention is a method of fabricating a semiconductor-on-insulator (SOI) chip, the SOI chip having a substrate, a buried oxide (BOX) layer disposed on the substrate and an active layer disposed on the BOX layer, the active layer divided into a first tile and a second tile. The method includes the steps of masking the second tile with a first mask, the first mask leaving the first tile exposed; implanting oxygen ions into the chip in the area of the first tile with a first energy level and a first dosage; stripping the first mask; masking the first tile with a second mask, the second mask leaving the second tile exposed; implanting oxygen ions into the chip in the area of the second tile with a second energy level and a second dosage; stripping the second mask; and annealing the chip.

BRIEF DESCRIPTION OF DRAWINGS

These and further features of the present invention will be apparent with reference to the following description and drawings, wherein.

DISCLOSURE OF INVENTION

Figure 1:
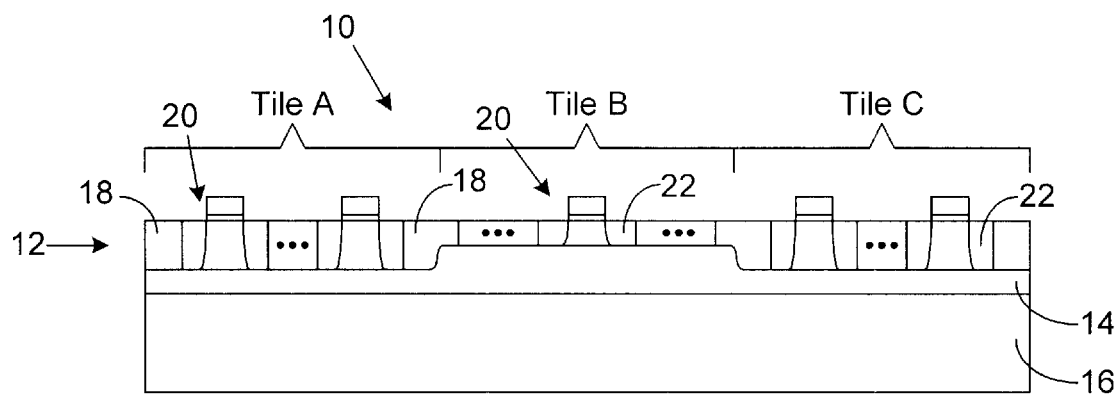
FIG. 1 is a cross-section of an exemplary SOI chip according to a first embodiment of the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 2:
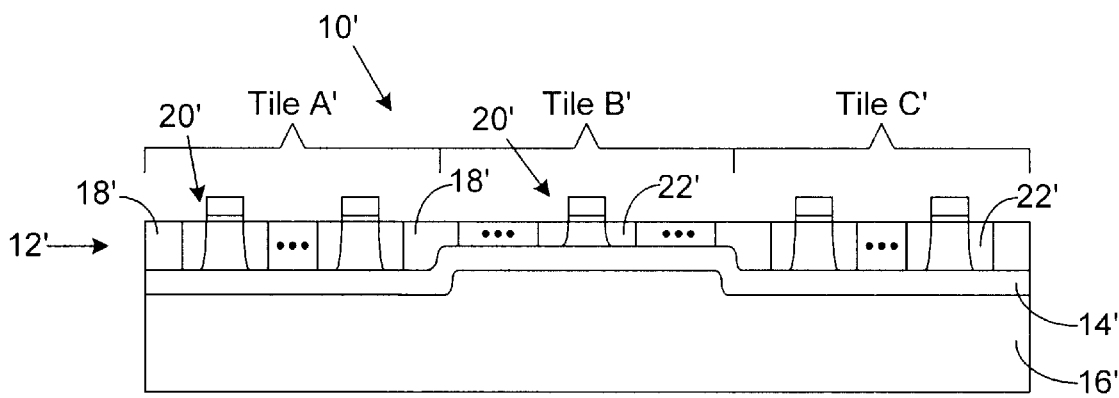
FIG. 2 is a cross-section of an exemplary SOI chip according to a second embodiment of the present invention.

With general reference to FIGS. 1 and 2, cross-sections of exemplary semiconductor-on-insulator (SOI) chips are illustrated where each exemplary chip is divided into tiles. The thickness of an active layer for each chip is substantially uniform over the area of each individual tile, but each tile may have a different thickness compared to other tiles on the chip. Selected tiles having a relatively thick active layer (e.g., about 50 nanometers (nm) to about 250 nm) can be used to fabricate partially depleted devices. Example partially depleted devices include MOSFET transistors used for digital circuitry. Other tiles having a relatively thinner thickness (e.g., about 40 nm to about 200 nm) can be used to fabricate fully depleted devices which generally have no floating body effects or a smaller degree of floating body effect relative to the partially depleted devices made in tiles having a larger thickness. Example fully depleted devices include transistors used for analog circuitry. Example analog circuits which can be fabricated in such a tile include random access memory (RAM) cells and phase locked loop (PLL) circuits. It is noted that the SOI structures and methods of forming the SOI structures described herein for an SOI chip can equally be applied to entire wafers.

Referring now to FIG. 1, a cross-section of an exemplary SOI chip 10 having an active layer 12 of non-uniform thickness according to a first embodiment is illustrated. The active layer 12 is disposed on a buried oxide (BOX) layer 14. The BOX layer 14 is disposed, in turn, on a silicon substrate 16. A method of fabricating the SOI chip 10 is described in more detail below.

Generally, the SOI chip 10 is divided into two or more regions, or tiles. For purposes of the disclosure herein, three tiles (or tiles A, B and C) are illustrated in FIG. 1. It is noted that number of tiles as well as the size, placement and active layer 12 thickness of each tile is left to the designer of the specific SOI chip being fabricated. In the illustrated example, the active layer 12 in the area of tiles A and C have a relatively thicker thickness and could be used for partially depleted devices. In the area of tile B, the active layer 12 has a relatively thinner thickness and could be used for fully depleted devices.

The thickness of the active layer 12 is defined primarily by the BOX layer 14. In general, a BOX layer 14 is formed by a separated-by-implanted oxygen (SIMOX) technique where oxygen ions are implanted into silicon material (e.g., a silicon wafer) with sufficient energy such that most of the oxygen ions penetrate and traverse an upper layer of the silicon material (the upper layer to become the active layer 12). The thickness of the upper layer traversed by the majority of the oxygen ions is dependent on the implantation energy and dosage as discussed in more detail below. The implanted oxygen ions combine with silicon atoms to form silicon dioxide ($SiO_2$) in what becomes the BOX layer 14 following an annealing step. Silicon below the deepest penetration depth of the majority of the implanted oxygen ions (also dependent on the implantation energy and dosage) forms the substrate 16.

Within the active layer 12, isolation regions 18, such as shallow trench isolation (STI) regions, define the placement of active regions 20 used for the fabrication of active devices 22. The fabrication of active devices 22, such as the illustrated transistors, using the active layer 12 is well known in the art and will not be described in great detail. One skilled in the art will immediately recognize that the illustrated active devices 22 are merely exemplary and that hundreds, thousands or even millions of interconnected active devices 22 may be formed within the area of a tile and these devices may include other circuit elements such as transistors, diodes, resistors, capacitors and the like.

Referring now to FIG. 2, a cross-section of another exemplary SOI chip 10' having an active layer 12' of non-uniform thickness according to a second embodiment is illustrated. The active layer 12' is disposed on a BOX layer 14'. The BOX layer 14' is disposed, in turn, on a silicon substrate 16'. Similar to the SOI chip 10, the active layer 12' is defined primarily by the BOX layer 14' which is formed using a SIMOX technique. A method of fabricating the SOI chip 10' is described in more detail below.

Generally, the SOI chip 10' is divided into two or more regions, or tiles. For purposes of the disclosure herein, three tiles (or tiles A', B' and C') are illustrated in FIG. 2. It is noted that number of tiles as well as the size, placement and active layer 12' thickness of each tile is left to the designer of the specific SOI chip being fabricated. In the illustrated example, the active layer 12' in the area of tiles A' and C' have a relatively thicker thickness and could be used for partially depleted devices. In the area of tile B', the active layer 12' has a relatively thinner thickness and could be used for fully depleted devices.

Within the active layer 12', isolation regions 18', such as STI regions, define the placement of active regions 20' used for the fabrication of active devices 22'. The fabrication of active devices 22', such as the illustrated transistors, using the active layer 12' is well known in the art and will not be described in great detail. One skilled in the art will immediately recognize that the illustrated active devices 22' are merely exemplary and that hundreds, thousands or even millions of interconnected active devices 22' may be formed within the area of a tile and these devices may include other circuit elements such as transistors, diodes, resistors, capacitors and the like.

Figure 3:
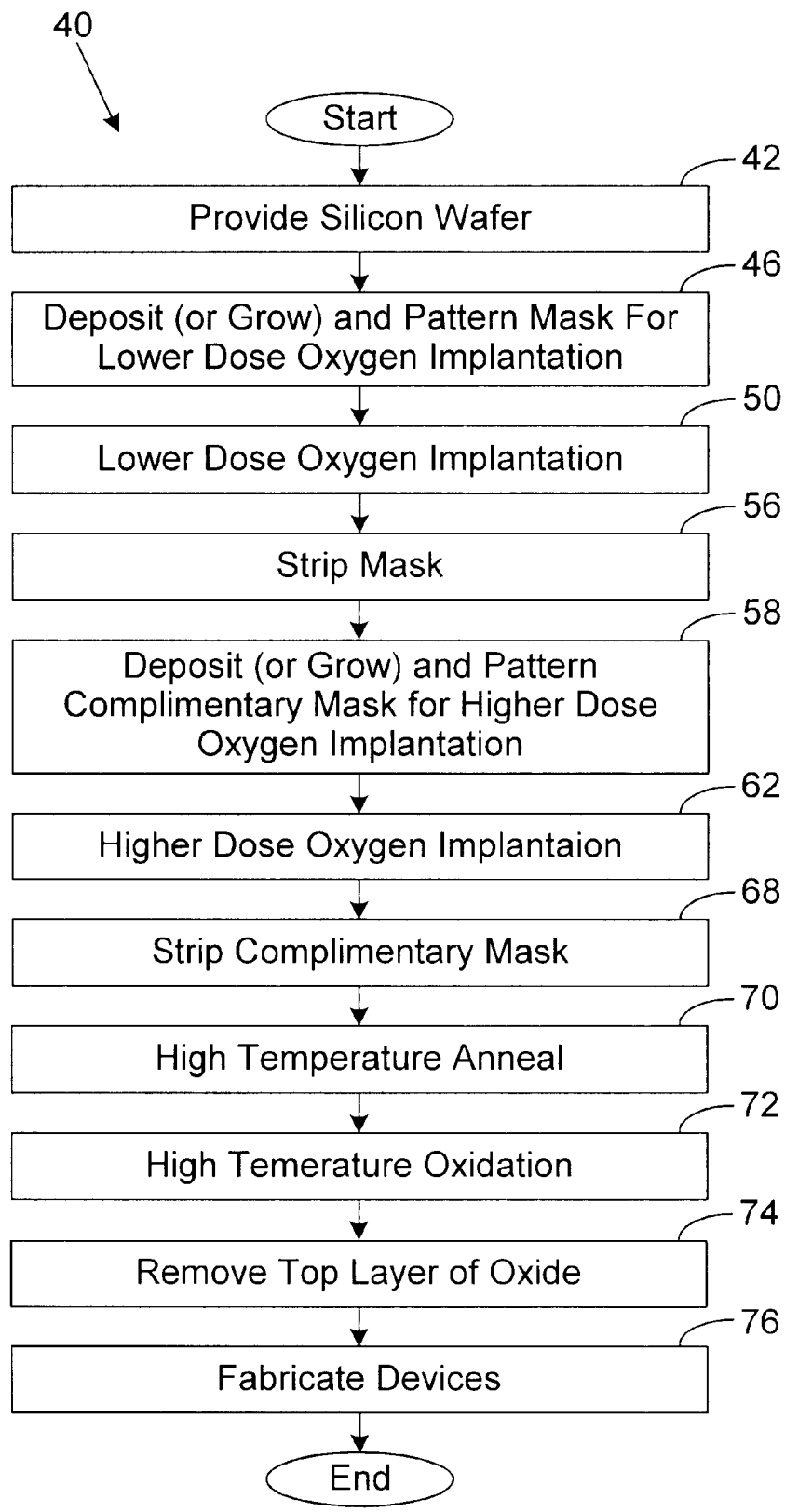
FIG. 3 is a flow chart of a method of manufacturing an SOI chip according to the first embodiment.
Figure 4A:
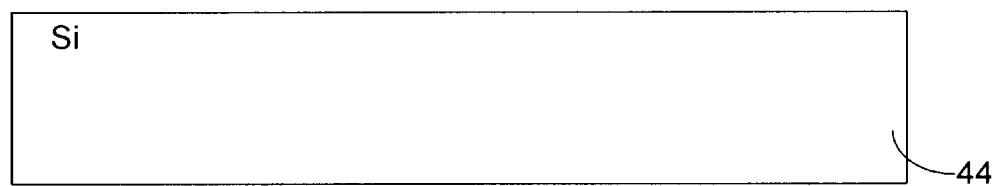
FIGS. 4a–4d are cross-sections of the SOI chip according to the first embodiment in various stages of manufacture.

Referring now to FIG. 3, a method 40 of fabricating the SOI chip 10 is illustrated in flow chart format. With additional reference to FIG. 4a, the method 40 starts in step 42 where silicon material 44, such as in the form of a wafer, is provided according to conventional techniques.

Figure 4B:
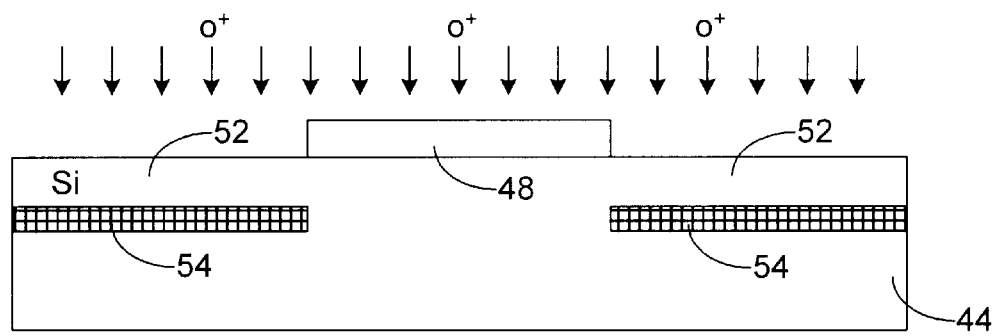

Next, in step 46, and as illustrated in FIG. 4b, the silicon material 44 is masked with a mask 48 to define an area or areas of the silicon material 44 to be exposed to lower dose oxygen ion implantation. More specifically, the mask 48 is deposited or grown and then patterned to leave exposed a portion or portions of the silicon material 44 to be formed into tiles having a thicker active layer 12, such as, for example, tiles A and C in FIG. 1. The material for the mask 48, and the other masks described below, can be, for example, an oxide, a nitride or other suitable material.

After the silicon material 44 has been masked in step 46, the silicon material 44 is exposed to lower dose oxygen implantation in step 50. More specifically, oxygen ions ($O^+$) are implanted at an energy in the range of about 50 keV to about 200 keV and a dosage of about $2.0 \times 10^{17}$ atoms/cm$^2$ to about $2.0 \times 10^{18}$ atoms/cm$^2$. The oxygen ions penetrate the silicon material 44 and most of the oxygen ions traverse an upper layer 52 of the silicon material 44. The oxygen ions traversing the upper layer 52 travel into the silicon material 44 in a depth ranging from about 50 nm to about 700 nm, forming a implanted regions 54. Following oxygen implantation in step 50, the mask 48 formed in step 46 is stripped in step 56.

Figure 4C:
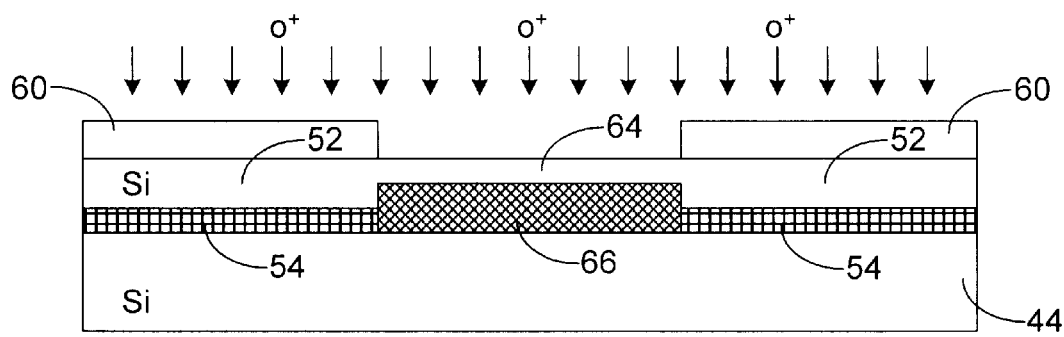

Next, in step 58, and as illustrated in FIG. 4c, the silicon material 44 is masked with a mask 60 to define an area or areas of the silicon material 44 to be exposed to higher dose oxygen ion implantation. The mask 60 is complementary to the mask 48 and may provide exposure overlap with the mask 48 so that a continuous BOX layer 14 is formed by the method 40. More specifically, the mask 60 is deposited or grown and then patterned to cover the areas left exposed by the mask 48 thereby leaving exposed a portion or portions of the silicon material 44 to be formed into tiles having a thinner active layer 12, such as, for example, tile B in FIG. 1.

After the silicon material 44 has been masked in step 58, the silicon material 44 is exposed to higher dose oxygen implantation in step 62. More specifically, oxygen ions ($O^+$) are implanted at an energy in the range of about 50 keV to about 200 keV and a dosage of about $2.0 \times 10^{17}$ atoms/cm$^2$ to about $2.0 \times 10^{18}$ atoms/cm$^2$. It is noted that the energy level for the oxygen implantation in steps 50 and 62 is selected to be preferably the same or approximately the same. It is also noted that, in most cases, the higher oxygen implantation dose in step 62 is only slightly higher than the lower oxygen implantation dose in step 50. For example, the higher dose can exceed the lower dose by about $0.2 \times 10^{17}$ atoms/cm$^2$, but can also exceed the lower dose by up to about $1.2 \times 10^{18}$ atoms/cm$^2$. The oxygen ions penetrate the silicon material 44 and most of the oxygen ions traverse an upper layer 64 of the silicon material 44. The oxygen ions traversing the upper layer 64 travel into the silicon material 44 in a depth ranging from about 40 nm to about 700 nm, forming an implanted region 66. Following oxygen implantation in step 62, the mask 60 formed in step 58 is stripped in step 68.

It is noted that following the oxygen implantation steps 50 and 62, the upper layers of silicon 52 and 64 have a slightly higher content of oxygen than the starting silicon material 44. However, this quantity of oxygen does not significantly affect the devices later formed in the active layer 12. The depth of the oxygen ion penetration is primarily dependent on the implantation energy and dose. At a certain depth, the oxygen concentration will be great enough to form the BOX layer 14 following an annealing step and, optionally, an oxidation step, each of which are described below (noting that oxide formation may actually commence during the oxygen implantation steps 50 and 62). In addition, some oxygen in the upper layers 52 and 64 migrates to the boundaries of the developing buried oxide during the annealing and/or oxidation steps discussed below.

Figure 4D:
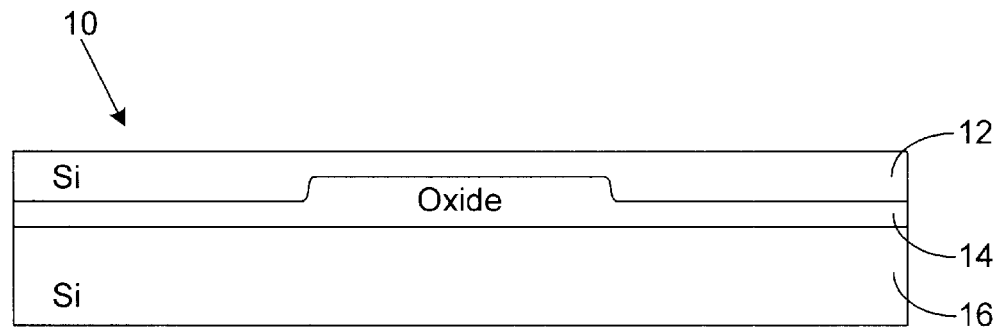

Next, in steps 70–74, and as illustrated in FIG. 4d, the oxygen implanted silicon material 44 is annealed at high temperature and optionally oxidized at a high temperature to form a homogenous layer of oxide, or the BOX layer 14, from the implanted regions 54 and 66. In one embodiment, the silicon material 44 is annealed at a temperature of about 1250° C. to about 1350° C. for a period of about two hours to about six hours in step 70.

As mentioned, following the anneal step 70, the silicon material 44 can be subjected to a high temperature oxidation in step 72. The oxidation step 72 is generally carried out when the method 40 includes an oxygen implantation step having a dose of about $1.2 \times 10^{18}$ atoms/cm$^2$ or less. The oxidation step 72 is carried out at a temperature of about 1250° C. to about 1350° C. for about two hours to about ten hours and in a pure (i.e., 100%), or nearly pure, oxygen atmosphere. The oxidation step 74 acts to form a thicker and more continuous layer of buried oxide by removing holes (e.g., gaps in the oxygen implantation) that may exist after relatively low dose oxygen implantation and remain after the anneal step 70. More specifically, oxygen from the oxygen atmosphere defuses through the silicon material 44 to react with the silicon material 44 at the interface of the silicon material 44 and the implanted regions 54 and 66 thereby increasing the thickness of the implanted regions 54 and 66 and making the resulting BOX layer 14 more homogenous and less conductive.

Following the annealing step 70 and, if conducted, the oxidation step 72, an oxide removal step 74 is carried out. It is noted that the annealing step 70 is carried out in a gas environment where oxygen is present to protect the silicon material 44 from disadvantageous effects, such as pitting. During the annealing process, at least the top surface of the silicon material 44 is oxidized. The oxidation step 72, if carried out, also results in oxidation of at least the top surface of the silicon material 44. The resulting oxide layer on at least the top surface of the silicon material 44 is removed in step 74 (other surfaces may also have oxide removed therefrom). It is noted that the thickness of the upper layers 52 and 64, and hence the thickness of the resulting active layer 12, will be reduced by the amount of silicon material 44 consumed due to oxidation in steps 70 and 72. If the oxidation step 72 is not carried out, about 30 nm to about 100 nm of the silicon material will be consumed. If the oxidation step 72 is carried out in addition to the anneal step 70, about 50 nm to about 230 nm of the silicon material will be consumed. The amount of oxide material formed during step 70 and/or step 72, and removed in step 74, is about 2.22 times the amount of consumed silicon material (i.e., the consumed silicon thickness is about 0.45 times the grown oxide thickness). Therefore, the implantation energy and dose in steps 50 and 62 should be adjusted accordingly so that the thickness of the active layer 12 results in the desired final thickness. The removal step 74 can be carried out using, for example, a wet etch, using, for example, hydrofluoric acid.

The resulting structure of the chip 10 has the active layer 12 disposed on the BOX layer 14 which is, in turn, disposed on the substrate 16. The varying dose of oxygen implantation in steps 50 and 62 result in different thicknesses of the implanted regions 54 and 66 and, similarly, different thicknesses of the respective upper layers 52 and 64. After annealing, optional oxidation and top oxide removal, these different thicknesses result in the active layer 12 having thin and thick tiles, also referred to as thin and thick silicon films, on a single SOI chip 10. The thin and thick silicon films can respectively be used for the fabrication of fully depleted devices and partially depleted devices in step 76 as schematically illustrated FIG. 1. It is noted that the SOI chip 10 can be fabricated with equivalent results by reversing sets of steps 46/50/56 and 58/62/68. In addition, in situations where the oxidation step 72 is carried out, the anneal step 70 can be followed by its own oxide removal step and a second oxide removal step can be conducted after the oxidation step 72.

Figure 5:
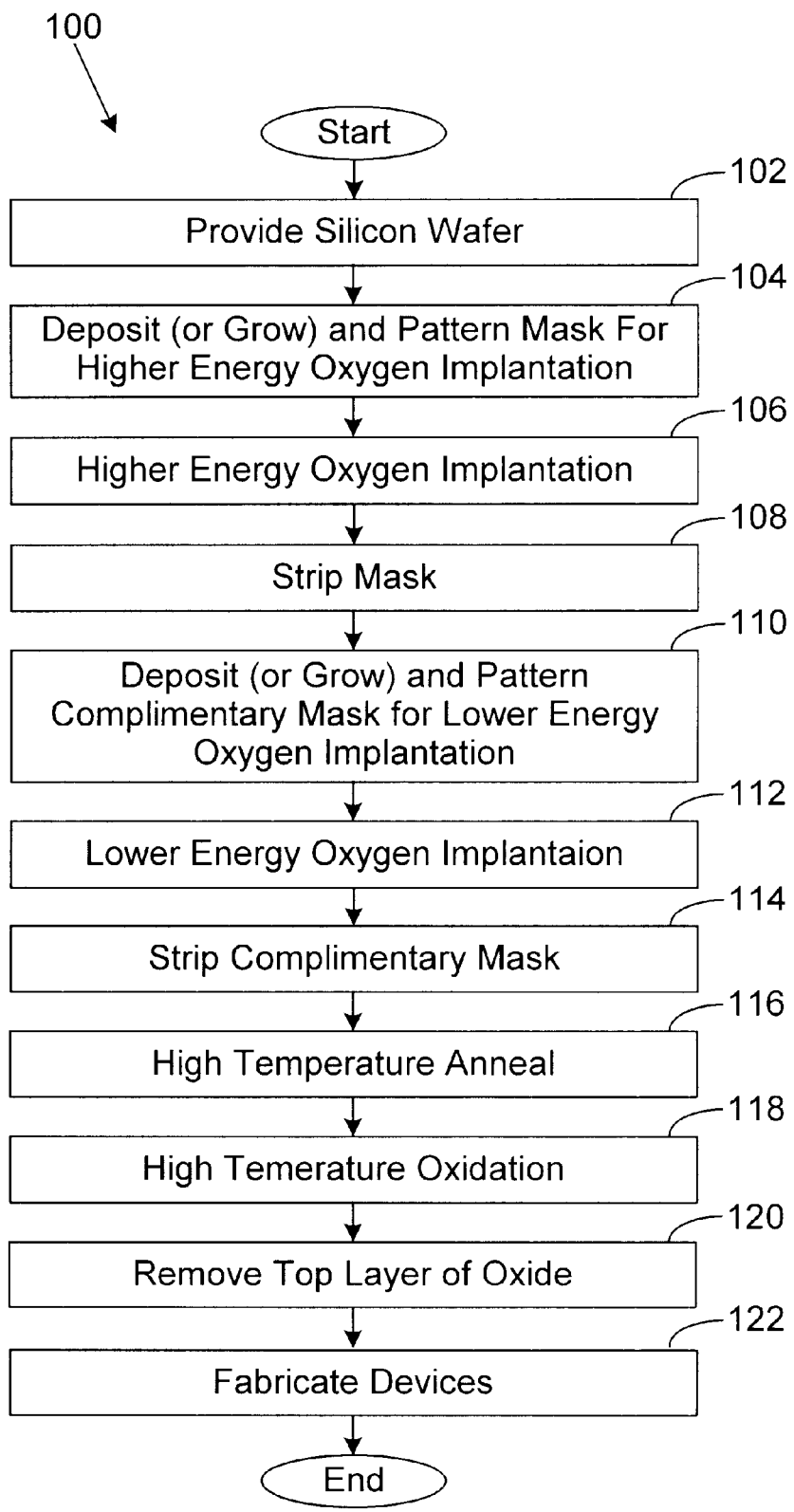
FIG. 5 is a flow chart of a method of manufacturing an SOI chip according to the second embodiment.
Figure 6A:
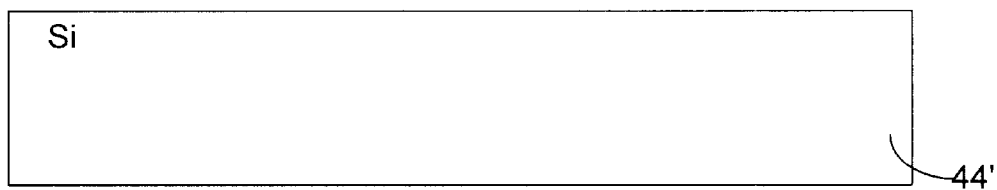
FIGS. 6a–6d are cross-sections of the SOI chip according to the second embodiment in various stages of manufacture.

Referring now to FIG. 5, a method 100 of fabricating the SOI chip 10' is illustrated in flow chart format. With additional reference to FIG. 6a, the method 100 starts in step 102 where silicon material 44', such as in the form of a wafer, is provided according to conventional techniques.

Figure 6B:
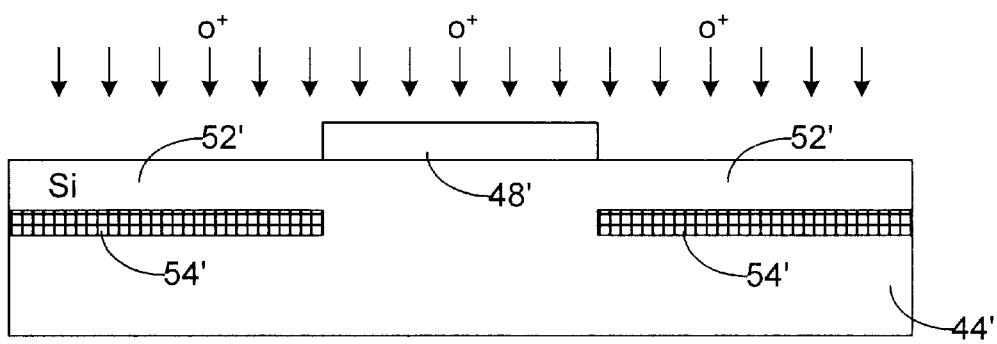

Next, in step 104, and as illustrated in FIG. 6b, the silicon material 44' is masked with a mask 48' to define an area or areas of the silicon material 44' to be exposed to higher energy oxygen ion implantation. More specifically, the mask 48' is deposited or grown and then patterned to leave exposed a portion or portions of the silicon material 44' to be formed into tiles having a thicker active layer 12', such as, for example, tiles A' and C' in FIG. 2.

After the silicon material 44' has been masked in step 104, the silicon material 44' is exposed to higher energy oxygen implantation in step 106. More specifically, oxygen ions (O$^+$) are implanted at an energy in the range of about 100 keV to about 200 keV and a dosage of about $2.0 \times 10^{17}$ atoms/cm$^2$ to about $2.0 \times 10^{18}$ atoms/cm$^2$. The oxygen ions penetrate the silicon material 44' and most of the oxygen ions traverse an upper layer 52' of the silicon material 44'. The oxygen ions traversing the upper layer 52' travel into the silicon material 44' in a depth ranging from about 50 nm to about 700 nm, forming implanted regions 54'. Following oxygen implantation in step 106, the mask 48' formed in step 104 is stripped in step 108.

Figure 6C:
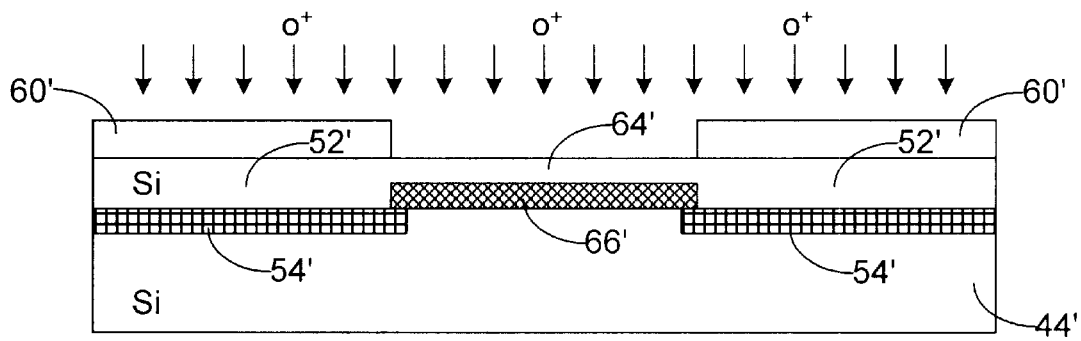

Next, in step 110, and as illustrated in FIG. 6c, the silicon material 44' is masked with a mask 60' to define an area or areas of the silicon material 44' to be exposed to lower energy oxygen ion implantation. The mask 60' is complementary to the mask 48' and may also provide exposure overlap with the mask 48' so that a continuous BOX layer 14' is formed by the method 100. More specifically, the mask 60' is deposited or grown and then patterned to cover the areas left exposed by the mask 48' thereby leaving exposed a portion or portions of the silicon material 44 to be formed into tiles having a thinner active layer 12', such as, for example, tile B' in FIG. 2.

After the silicon material 44' has been masked in step 110, the silicon material 44' is exposed to lower energy oxygen implantation in step 112. More specifically, oxygen ions (O$^+$) are implanted at an energy in the range of about 50 keV to about 150 keV and a dosage of about $2.0 \times 10^{17}$ atoms/cm$^2$ to about $2.0 \times 10^{18}$ atoms/cm$^2$. It is noted that the dosage for the oxygen implantation in steps 106 and 112 is selected to be preferably the same or approximately the same. The oxygen ions penetrate the silicon material 44' and most of the oxygen ions traverse an upper layer 64' of the silicon material 44'. The oxygen ions traversing the upper layer 64 travel into the silicon material 44' in a depth ranging from about 40 nm to about 600 nm, forming an implanted region 66'. It is noted that ends of the silicon-dioxide layer region 66' will slightly overlap with ends of the silicon-dioxide layer 54' if the mask 60' provides exposure overlap with the mask 48'. Following oxygen implantation in step 112, the mask 60' formed in step 110 is stripped in step 114.

It is noted that following the oxygen implantation steps 106 and 112, the upper layers of silicon 52' and 64' have a slightly higher content of oxygen than the starting silicon material 44'. However, this quantity of oxygen does not significantly affect the devices later formed in the active layer 12'. The depth of the oxygen ion penetration is primarily dependent on the implantation energy and dose. At a certain depth, the oxygen concentration will be great enough to form the BOX layer 14' following an annealing step and, optionally, an oxidation step, each of which are described below (noting that oxide formation may actually commence during the oxygen implantation steps 106 and 112). In addition, some oxygen in the upper layers 52' and 64' migrates to the boundaries of the developing buried oxide during the annealing and/or oxidation steps discussed below.

Figure 6D:
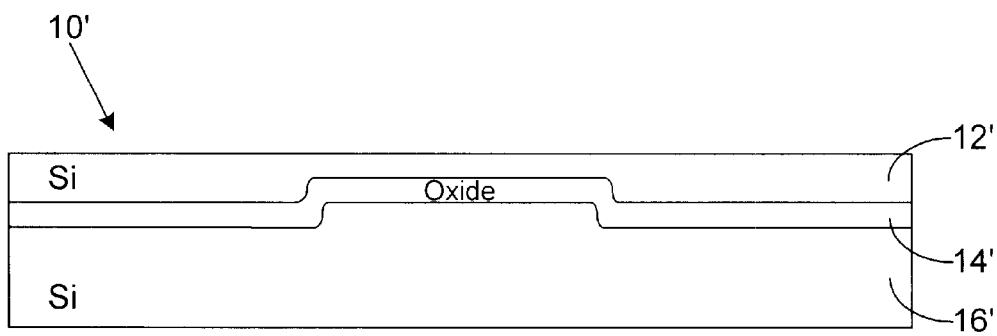

Next, in steps 116–120, and as illustrated in FIG. 6d, the oxygen implanted silicon material 44' is annealed at a high temperature and optionally oxidized at a high temperature to form a homogenous layer of oxide, or the BOX layer 14' formed from the implanted regions 54' and 66'. In one embodiment, the silicon material 44' is annealed at a temperature of about 1250° C. to about 1350° C. for a period of about two hours to about six hours in step 116.

As mentioned, following the anneal step 116, the silicon material 44' can be subjected to a high temperature oxidation in step 118. The oxidation step 118 is generally carried out when the method 100 includes an oxygen implantation step having a dose of about $1.2 \times 10^{18}$ atoms/cm$^2$ or less. The oxidation step 118 is carried out at a temperature of about 1250° C. to about 1350° C. for about two hours to about ten hours and in a pure (i.e., 100%), or nearly pure, oxygen atmosphere. The oxidation step 118 acts to form a thicker and more continuous layer of buried oxide by removing holes (e.g., gaps in the oxygen implantation) that may exist after relatively low dose oxygen implantation and remain after the anneal step 116. More specifically, oxygen from the oxygen atmosphere defuses through the silicon material 44' to react with the silicon material 44' at the interface of the silicon material 44' and the implanted regions 54' and 66' thereby increasing the thickness of the implanted regions 54' and 66' and making the resulting BOX layer 14' more homogenous and less conductive.

Following the annealing step 116 and, if conducted, the oxidation step 118, an oxide removal step 120 is carried out. It is noted that the annealing step 116 is carried out in a gas environment where oxygen is present to protect the silicon material 44' from disadvantageous effects, such as pitting. During the annealing process, at least the top surface of the silicon material 44' is oxidized. The oxidation step 118, if carried out, also results in oxidation of at least the top surface of the silicon material 44'. The resulting oxide layer on at least the top surface of the silicon material 44' is removed in step 120 (other surfaces may also have oxide removed therefrom). It is noted that the thickness of the upper layers 52' and 64', and hence the thickness of the resulting active layer 12', will be reduced by the amount of silicon material 44' consumed due to oxidation in steps 116 and 118. If the oxidation step 118 is not carried out, about 30 nm to about 100 nm of the silicon material will be consumed. If the oxidation step 118 is carried out in addition to the anneal step 116, about 50 nm to about 230 nm of the silicon material will be consumed. The amount of oxide material formed during step 116 and/or step 118, and removed in step 120, is about 2.22 times the amount of consumed silicon material (i.e., the consumed silicon thickness is about 0.45 times the grown oxide thickness). Therefore, the implantation energy and dose in steps 106 and 112 should be adjusted accordingly so that the thickness of the active layer 12' results in the desired final thickness. The removal step 120 can be carried out using, for example, a wet etch, using, for example, hydrofluoric acid.

The resulting structure of the chip 10' has the active layer 12' disposed on the BOX layer 14' which is, in turn, disposed on the substrate 16'. The varying energy levels of oxygen implantation in steps 106 and 112 result in different thicknesses of the implanted regions 54' and 66' and, similarly, different thicknesses of the respective upper layers 52' and 64'. After annealing, optional oxidation and top oxide removal, these different thicknesses result in the active layer 12' having thin and thick tiles, also referred to as thin and thick silicon films, on a single SOI chip 10'. The thin and thick silicon films can respectively be used for the fabrication of fully depleted devices and partially depleted devices in step 122 as schematically illustrated FIG. 2. It is noted that the SOI chip 10 can be fabricated with equivalent results by reversing sets of steps 104/106/108 and 110/112/114 provided that sufficient exposure overlap is introduced by the masks 48' and 60'. In addition, in situations where the oxidation step 118 is carried out, the anneal step 116 can be followed by its own oxide removal step and a second oxide removal step can be conducted after the oxidation step 118.

In both methods 40 and 100, it is noted that oxygen is implanted locally to the exposed tile(s) during the implantation steps. In other words, oxygen is generally not implanted across the entire chip at once but is implanted under the upper layer of silicon (or active layer) for one or more tiles at a time.

Although particular embodiments of the invention have been described in detail, it is understood that the invention is not limited correspondingly in scope, but includes all changes, modifications and equivalents coming within the spirit and terms of the claims appended hereto. For example, a chip having an active layer with more than two thicknesses can be fabricated. Such a chip, by way of example, could have a first tile with an active layer thickness of about 150 nm, a second tile with an active layer thickness of about 100 nm and a third tile with an active layer thickness of about 80 nm.

As another example modification, a chip can be formed which has an active layer that has been varied in thickness by implanting a BOX layer formed by a first oxygen ion implantation having a first energy level and a first dosage level and a second oxygen ion implantation having a second energy level different from the first energy level and a second dosage level different from the first dosage level.

In addition, the reason for varying the thickness of the active layer is not limited to forming tiles used for the fabrication of partially depleted device and fully depleted device on one chip or the fabrication of analog devices and digital devices on one chip. The thickness differential between the tiles could be used to control other aspects of the active device, such as source/drain doping, junction capacitance, floating body effects, switching speed and the like. Another application includes building NMOS and PMOS transistors in different tiles of the SOI chip such that the NMOS devices have an active layer with a first thickness and the PMOS devices have an active layer with a second thickness. The varying thicknesses of the active layer for the NMOS and PMOS devices can be used to adjust for different doping profiles of the different device types to optimize, for example, switching behavior.

In another alternative embodiment, the silicon material forming the active layer can be implanted or reacted with another material to achieve desired material properties before or during device fabrication. For example, the active layer can be implanted with germanium to form silicon-germanium (SiGe) regions.

In yet another example modification, after formation of the SOI chip using the methods 40 or 100 but before device fabrication, the thickness of the active layer can be decreased, using, for example, etching and/or additional oxidation, or increased using, for example, selective or nonselective silicon epitaxy.

What is claimed is:

1. A method of fabricating a semiconductor-on-insulator (SOI) chip, the SOI chip having a substrate, a buried oxide (BOX) layer disposed on the substrate and an active layer disposed on the BOX layer, the active layer divided into a first tile and a second tile, the method comprising the steps of:

masking the second tile with a first mask, the first mask leaving the first tile exposed;

implanting oxygen ions into the chip in the area of the first tile with a first energy level and a first dosage, wherein the first mask substantially blocks implantation of oxygen ions into the second tile;

stripping the first mask;

masking the first tile with a second mask, the second mask leaving the second tile exposed and having exposure overlap with the first mask;

implanting oxygen ions into the chip in the area of the second tile with a second energy level and a second dosage, wherein the second mask substantially blocks implantation of oxygen ions into the first tile;

stripping the second mask; and annealing the chip after each of the first and second masks have been stripped so as to define the BOX layer disposed continuously under the first and the second tiles and such that the first tile has a first thickness and the second tile has a second thickness, the second thickness being smaller than the first thickness.

2. The method of claim 1, further comprising the step of removing a top layer of oxide formed during the annealing step.

3. The method of claim 1, further comprising the step of oxidizing the chip using high temperature oxidation.

4. The method of claim 3, further comprising the step of removing a top layer of oxide formed during the annealing and oxidizing steps.

5. The method of claim 1, wherein the thickness of the first tile is in the range of about 50 nm to about 250 nm.

6. The method of claim 5, wherein the thickness of the second tile is in the range of about 40 nm to about 200 nm.

7. The method of claim 1, wherein the thickness of the second tile is in the range of about 40 nm to about 200 nm.

8. The method of claim 1, further comprising forming a plurality of partially depleted semiconductor devices from the active layer in the area of the first tile and forming a plurality of fully depleted semiconductor devices from the active layer in the area of the second tile.

9. The method of claim 8, wherein the fully depleted devices form analog circuitry and the partially depleted devices form digital circuitry.

10. A method of fabricating a semiconductor-on-insulator (SOI) chip, the SOI chip having a substrate, a buried oxide (BOX) layer disposed on the substrate and an active layer disposed on the BOX layer, the active layer divided into a first tile and a second tile, the method comprising the steps of:

masking the second tile with a first mask, the first mask leaving the first tile exposed;

implanting oxygen ions into the chip in the area of the first tile with a first energy level and a first dosage;

stripping the first mask;

masking the first tile with a second mask, the second mask leaving the second tile exposed;

implanting oxygen ions into the chip in the area of the second tile with a second energy level and a second dosage, wherein the first energy level and the second energy level are generally the same, and the first dosage being less than the second dosage;

stripping the second mask; and annealing the chip after each of the first and second masks have been stripped so as to define the BOX layer disposed continuously under the first and the second tiles and such that the first tile has a first thickness and the second tile has a second thickness, the second thickness being smaller than the first thickness.

11. The method of claim 10, wherein the first energy level and the second energy level are in the range of about 50 keV to about 200 keV, the first dosage is in the range of about $2.0 \times 10^{17}$ atoms/cm$^2$ to about $2.0 \times 10^{18}$ atoms/cm$^2$ and the second dosage is in the range of about $2.0 \times 10^{17}$ atoms/cm$^2$ to about $2.0 \times 10^{18}$ atoms/cm$^2$.

12. The method of claim 10, wherein the first dosage is less than the second dosage by about $0.2 \times 10^{17}$ atoms/cm$^2$ to about $1.2 \times 10^{18}$ atoms/cm$^2$.

13. The method of claim 10, wherein during implantation of oxygen ions into the chip in the area of the first tile, the first mask substantially blocks implantation of oxygen ions into the second tile and during implantation of oxygen ions into the chip in the area of the second tile, the second mask substantially blocks implantation of oxygen ions into the first tile.

14. The method of claim 10, wherein the second mask has an exposure overlap with the first mask.

15. A method of fabricating a semiconductor-on-insulator (SOI) chip, the SOI chip having a substrate, a buried oxide (BOX) layer disposed on the substrate and an active layer disposed on the BOX layer, the active layer divided into a first tile and a second tile, the method comprising the steps of:

masking the second tile with a first mask, the first mask leaving the first tile exposed;

implanting oxygen ions into the chip in the area of the first tile with a first energy level and a first dosage;

stripping the first mask;

masking the first tile with a second mask, the second mask leaving the second tile exposed;

implanting oxygen ions into the chip in the area of the second tile with a second energy level and a second dosage, wherein the first dosage and the second dosage are generally the same, and the first energy level is greater than the second energy level;

stripping the second mask; and annealing the chip after each of the first and second masks have been stripped so as to define the BOX layer disposed continuously under the first and the second tiles and such that the first tile has a first thickness and the second tile has a second thickness, the second thickness being smaller than the first thickness.

16. The method of claim 15, wherein the first dosage and the second dosage are in the range of $2.0\times10^{17}$ atoms/cm$^2$ to about $2.0\times10^{18}$ atoms/cm$^2$, the first energy level is in the range of 100 keV to about 200 keV and the second energy level is in the range of about 50 keV to about 150 keV.

17. The method of claim 15, wherein during implantation of oxygen ions into the chip in the area of the first tile, the first mask substantially blocks implantation of oxygen ions into the second tile and during implantation of oxygen ions into the chip in the area of the second tile, the second mask substantially blocks implantation of oxygen ions into the first tile.

18. The method of claim 15, wherein the second mask has an exposure overlap with the first mask.

* * * * *